(12) United States Patent
Frost et al.

(10) Patent No.: US 11,967,968 B2
(45) Date of Patent: Apr. 23, 2024

(54) APPARATUS AND METHOD OF OVER-CURRENT LIMIT FOR MULTI-CHANNEL DIGITAL-TO-ANALOG CONVERTERS

(71) Applicant: Texas Instruments Incorporated, Dallas, TX (US)

(72) Inventors: Paul Thomas Frost, Tucson, AZ (US);
Aditya Vighnesh Ramakanth Bommireddipalli, Tucson, AZ (US);
Hugo Cheung, Tucson, AZ (US);
Abdullah Yilmaz, Tucson, AZ (US);
Ruben Antonio Vasquez, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/587,972

(22) Filed: Jan. 28, 2022

(65) Prior Publication Data
US 2023/0246651 A1    Aug. 3, 2023

(51) Int. Cl.
*H03M 1/00* (2006.01)
*H03M 1/06* (2006.01)

(52) U.S. Cl.
CPC ................. *H03M 1/0626* (2013.01)

(58) Field of Classification Search
CPC .......... H03M 1/66; H03M 1/68; H03M 1/662; H03M 1/1009; H03M 1/1033;
(Continued)

(56) References Cited

U.S. PATENT DOCUMENTS

| | | | | |
|---|---|---|---|---|
| 6,130,632 A | * | 10/2000 | Opris | .................. H03M 1/1061 341/120 |
| 6,680,634 B1 | * | 1/2004 | Ruha | ..................... H03L 7/0816 327/158 |

(Continued)

FOREIGN PATENT DOCUMENTS

RU    2723463 C1    6/2020

OTHER PUBLICATIONS

International Search Report in corresponding PCT Application No. PCT/US2023/011814, mailed May 23, 2023.
(Continued)

*Primary Examiner* — Linh V Nguyen
(74) *Attorney, Agent, or Firm* — Valerie M. Davis; Frank D. Cimino

(57) ABSTRACT

A system includes a plurality of digital-to-analog converter (DAC) channels. Each DAC channel includes a current control circuit which receives a start limit signal or an end limit signal. The current control circuit reduces an output current limit of the channel responsive to the start limit signal and increases the output current limit responsive to the end limit signal. Each channel includes a current sensor circuit adapted to measure the output current of the channel and provide a channel over-current alert signal if the output current rises above a high current limit. The system includes a controller which asserts the start limit signal if the number of channels exceeding the high current limit is greater than a maximum allowable number and asserts the end limit signal if the number of channels exceeding the high current limit is less than the maximum allowable number minus a hysteresis value.

20 Claims, 3 Drawing Sheets

(58) Field of Classification Search
CPC .. H03M 1/1061; H03M 1/1071; H03M 1/109; H03M 1/0673; H03M 1/0678; H03M 1/747; H03M 1/687; H03M 1/742; H03M 2200/451; H03M 3/193; H03M 3/21; H03M 3/24; H03M 1/0205; H03M 1/0211; H03M 1/0216; H03M 1/3247; H03M 1/52; H03M 1/523; H03M 1/565; H03M 2200/03; H03M 2200/102; H03M 2200/198; H03M 2200/426; H03M 3/19; H03M 3/245; H03M 3/68
USPC .................................. 341/118–121, 141, 144
See application file for complete search history.

(56) References Cited

U.S. PATENT DOCUMENTS

| | | | | |
|---|---|---|---|---|
| 7,106,036 | B1 * | 9/2006 | Collins | H02M 1/36 |
| | | | | 323/284 |
| 7,394,414 | B2 * | 7/2008 | Briaire | H03M 1/0653 |
| | | | | 341/118 |
| 7,504,976 | B1 * | 3/2009 | Pellon | H03M 3/504 |
| | | | | 341/143 |
| 7,623,361 | B2 * | 11/2009 | Basso | H02M 1/36 |
| | | | | 323/901 |
| 8,004,441 | B1 * | 8/2011 | Beukema | H03M 1/662 |
| | | | | 375/242 |
| 8,125,361 | B2 * | 2/2012 | Choe | H03M 1/1061 |
| | | | | 341/120 |
| 8,688,862 | B1 * | 4/2014 | Alley | G01R 31/3177 |
| | | | | 710/72 |
| 9,154,148 | B2 * | 10/2015 | Schafferer | H03M 1/06 |
| 9,252,797 | B1 * | 2/2016 | Kabir | H03M 1/665 |
| 9,325,337 | B1 * | 4/2016 | Dempsey | H03M 1/109 |
| 9,564,913 | B1 * | 2/2017 | Courcy | H03L 7/0891 |
| 9,716,508 | B1 * | 7/2017 | Zhang | H03M 1/0678 |
| 9,847,787 | B1 * | 12/2017 | Fry | H03M 1/0624 |
| 9,985,641 | B1 * | 5/2018 | Ray | H03M 1/108 |
| 10,075,643 | B2 * | 9/2018 | Lee | H04N 23/687 |
| 10,644,716 | B1 * | 5/2020 | Luo | H03M 1/68 |
| 10,833,687 | B1 * | 11/2020 | Hamilton | H03M 3/32 |
| 11,128,310 | B1 * | 9/2021 | Zhao | H03M 1/1071 |
| 2007/0121929 | A1 * | 5/2007 | Korcharz | G06F 1/26 |
| | | | | 379/413 |
| 2007/0280061 | A1 * | 12/2007 | Lan | G11B 20/10027 |
| 2008/0048573 | A1 * | 2/2008 | Ferentz | H05B 45/3725 |
| | | | | 315/193 |
| 2011/0019522 | A1 * | 1/2011 | Rees | G11B 7/126 |
| | | | | 369/59.11 |
| 2011/0194311 | A1 * | 8/2011 | Gaknoki | H02M 7/217 |
| | | | | 363/21.12 |
| 2022/0069703 | A1 * | 3/2022 | Krishnamurthy | H02M 3/1584 |
| 2022/0376699 | A1 * | 11/2022 | Moctezuma | H03M 1/665 |

OTHER PUBLICATIONS

Anderson Jack et al.: All Digital High Resolution Class D Amplifier Designs Using Power Supply Feed-Forward and Signal Feedback, CONFERENCE: 31st International Conference New Directions in High Resolution Audio; Jun. 2007. XP040508048, (Jun. 1, 2007). pp. 9-10.

* cited by examiner

APPARATUS AND METHOD OF OVER-CURRENT LIMIT FOR MULTI-CHANNEL DIGITAL-TO-ANALOG CONVERTERS

TECHNICAL FIELD

This description relates generally to digital-to-analog converters (DACs), and more particularly to over-current limits for multi-channels DACs.

BACKGROUND

Multi-channel DACs are used in radio base stations, radar systems, and other systems that utilize radio frequency (RF) power amplifiers to, for example, transmit signals (either over the air or through another media). In many applications, a power supply is utilized to power the multi-channel DACs, and the output of the multi-channel DACs may be coupled to respective dynamic loads (e.g., antenna). Because the current demand by the dynamic loads may vary, the DAC channels are generally designed to supply peak current demand of the loads. This, in turn, requires the power supply to be designed such that it is capable of satisfying the aggregate peak current demand of the loads coupled to all the DAC channels. Since the peak current demand of one or more dynamic loads may last only momentarily, utilizing a power supply capable of satisfying the peak current demands of all the loads leads to inefficient and expensive systems.

For example, a 16-channel DAC may be configured so that each DAC channel may be capable of supplying 50 mA peak current. Thus, a power supply capable of supplying 800 mA may be utilized to provide power to the DAC channels. At any time, only a small subset (e.g., 3) of the DAC channels may be required to supply output current that exceeds 50 mA (e.g., 60 mA) while the other 13 DAC channels may supply only 10 mA. Existing multi-channel DACs are configured so that if the output current of any individual DAC channel exceeds the peak current limit, the output of that DAC channel is pulled to a voltage supply (e.g., supply rail). The effect of this is that the DAC channel is no longer required to supply high output current to prevent the output voltage from dipping. As a result, the transistors of the DAC channel are prevented from being damaged. For example, if the output current of a DAC channel has a peak output limit of 50 mA but is supplying 60 mA, the output of the DAC channel is pulled to a voltage supply (supply rail). In many instances, even though the power supply may be capable of meeting total current demand of all the DAC channels because some of the DAC channels may be drawing less current, one or more DAC channels may be rendered inoperative because their output current exceed the peak current limit.

SUMMARY

In one aspect, a multi-channel digital-to-analog converter (DAC) system includes a plurality of DAC channels each including an input adapted to receive a digital input signal and to convert the digital input signal to an analog output signal. Each DAC channel includes a current control circuit which includes a first input adapted to receive a start limit signal or an end limit signal. The current control circuit reduces an output current limit of the output current of the DAC channel from a high current limit to a low current limit responsive to the start limit signal and increases the output current limit to the high current limit responsive to the end limit signal. Each DAC channel includes a current sensor circuit coupled to the current control circuit. The current sensor circuit measures the output current and provides a channel over-current alert signal if the output current rises above the high current limit. Each DAC channel includes an analog filter coupled to the current sensor circuit. The analog filter provides a filtered channel over-current alert signal in response to the channel over-current alert signal. The multi-channel DAC system includes a summer circuit coupled to each DAC channel. The summer circuit provides a summation signal indicating the number of DAC channels exceeding the high current limit. The multi-channel DAC system includes a controller coupled to the summer circuit. The controller asserts the start limit signal if the number of DAC channels exceeding the high current limit is greater than a maximum channel over-current limit signal and asserts the end limit signal if the number of channels exceeding the high current limit is less than the maximum channel over-current limit signal minus a hysteresis value.

In an additional aspect, the multi-channel DAC system includes a digital filter which has an input adapted to receive the end limit signal. The digital filter applies a time delay to the end limit signal. The digital filter allows the start limit signal to pass through without applying a time delay.

In an additional aspect, the analog filter is a low pass filter which removes high frequency components from the channel over-current alert signal and provides the filtered channel over-current alert signal.

In an additional aspect, a multi-channel DAC system includes a plurality of DAC channels. The DAC channels include respective inputs adapted to receive a digital input signal and convert the digital input signal to an analog output signal. The DAC channels each includes a current control circuit which includes a first input adapted to receive a start limit signal or a delayed end limit signal. The current control circuit dynamically adjusts an output current limit of the DAC channel by reducing the output current limit from a high current limit to a low current limit responsive to the start limit signal and increases the output current limit to the high current limit responsive to the delayed end limit signal. The DAC channels each includes a current sensor circuit adapted to measure the output current of the DAC channel and provide a channel over-current alert signal if the output current rises above the high current limit. The DAC channels each includes a low-pass filter which includes an input adapted to receive the channel over-current alert signal and. The low-pass filter removes high frequency components from the channel over-current alert signal and provides a filtered channel over-current alert signal. The multi-channel DAC system includes a summer circuit which includes inputs adapted to receive respective filtered channel over-current alert signals from the DAC channels and provide a summation signal indicating the number of DAC channels exceeding the high current limit. The multi-channel DAC system includes a controller which includes a first input adapted to receive a clock signal, a second input adapted to receive a hysteresis signal having a hysteresis value, a third input adapted to receive a maximum channel over-current limit signal indicating the maximum number of DAC channels allowed to exceed the high current limit, and a fourth input adapted to receive the summation signal. The controller asserts the start limit signal if the number of DAC channels exceeding the high current limit is greater the maximum channel over-current limit signal and asserts the end limit signal if the number of channels exceeding the high current limit is less than the maximum channel over-current limit signal minus the hysteresis value. The multi-channel DAC system includes a digital filter which includes an input adapted to receive the start limit signal or the end limit signal. The digital filter provides the delayed end limit signal by applying a time delay to the end limit signal but allows the start limit signal to pass through.

In an additional aspect, a method of over-current protection for a multi-channel digital-to-analog converter (DAC) includes measuring the output currents of DAC channels and providing channel over-current alert signals if the output currents rise above a high current limit. The method includes removing high-frequency components by filtering the channel over-current alert signals, and determining the total number of DAC channels exceeding the high current limit based on the filtered over-current alert signals. The method includes comparing the total number of DAC channels exceeding the high current limit to a maximum channel over-current limit and to the maximum channel over-current limit minus a hysteresis value. The method includes asserting a start limit signal if the total number of DAC channels exceeding the high current limit is greater than the maximum channel over-current limit, and asserting an end limit signal if the total number of DAC channels exceeding the high current limit is less than the maximum channel over-current limit minus the hysteresis value. The method includes reducing an output current limit of the DAC channels from the high current limit to a lower current limit responsive to the start limit signal, and increasing the output current limit of the DAC channels from the lower current limit to the high current limit responsive to the end limit signal.

BRIEF DESCRIPTION OF THE DRAWINGS

The same reference numerals or other feature designators are used in the drawings to designate the same or similar (functionally and/or structurally) features.

DETAILED DESCRIPTION

In some example embodiments, a cumulative current limit of a high-channel-count DAC is implemented, allowing for an individual or defined subset of channels to enter their maximum current state, but will enforce a global current limit to all DAC channels when the total number of channels in a high-current state exceeds a defined maximum limit. These example embodiments may allow individual channels to source the maximum current that the DAC is capable of momentarily providing, while still allowing for the power supply to be rated for a value closer to the nominal load. Some example embodiments facilitate an independent power domain cumulative current limit control. Some example embodiments may include: (i) high-current (which may be defined during device fabrication, defined by an end-user or defined during operation) detection and output flags for each DAC channel; (ii) current limiting on a per-channel basis that may facilitate limiting maximum current (either on a per-channel basis or as a cumulative value) to a pre-defined value (which may be defined during device fabrication, defined by an end-user or defined during operation); and/or (iii) a state machine or other processor or controller to maintain/limit the number of channels in a high-current-state, set the current limits, and/or implement a hysteresis for enabling and disabling the current limit.

Figure 1A:
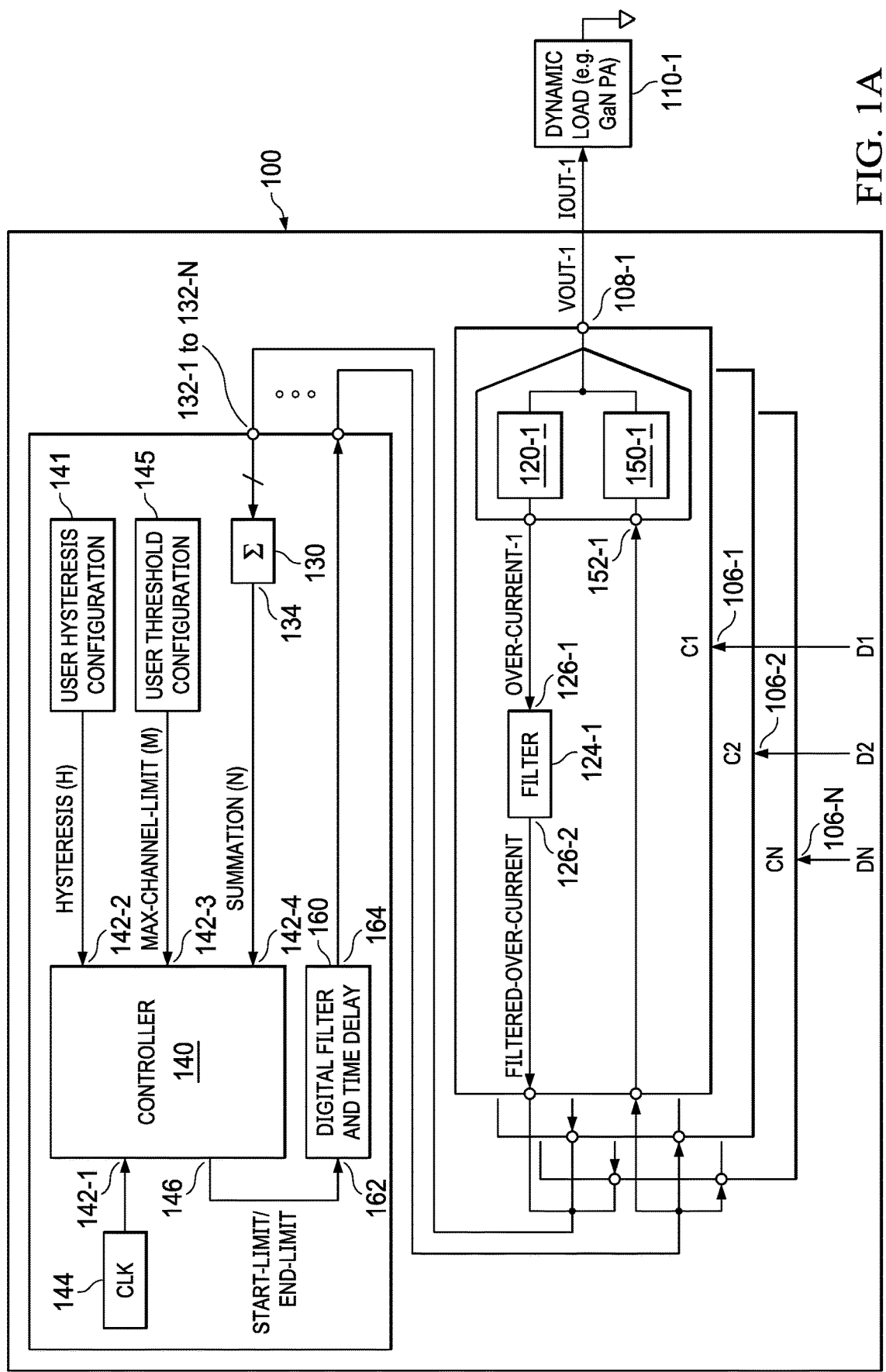
FIG. 1A is a block diagram of a multi-channel DAC system of an example embodiment.

FIG. 1A is a block diagram of a multi-channel DAC system 100 of an example embodiment. The system 100 includes a plurality of DAC channels (C1, C2,CN) adapted to receive digital input signals (D1, D2, . . . DN, respectively). The DAC channel C1 receives the digital input signal D1 at an input 106-1, the DAC channel C2 receives the digital input signal D2 at an input 106-2, and the DAC channel CN receives the digital input signal DN at an input 106-N. The digital input signals D1-DN are also referred to as digital input words. The DAC channels C1-CN convert the digital input signals D1-DN to respective analog output signals (VOUT-1, VOUT-2 . . . VOUT-N, respectively) which are provided at respective outputs (108-1, 108-2, . . . 108-N, respectively). Only the output 108-1 and analog output signal VOUT-1 are shown in FIG. 1 for simplicity. The output signals VOUT-1, VOUT-2 . . . VOUT-N are analog representations of the respective digital input signals D1-DN.

Each of the DAC channels C1-CN have respective loads coupled to their outputs, but FIG. 1 only illustrates a single load 110-1 for simplicity. The load 110-1 is coupled between the output 108-1 and a common potential (e.g., ground). In some example embodiments, the loads may be dynamic loads such as power amplifiers or RF transceivers. Depending on the operating state of the dynamic loads, output current demand from the DAC channels C1-CN may vary. For example, C1-CN may be coupled to respective power amplifiers (not shown in FIG. 1) where each power amplifier may in turn be coupled to an associated antenna or other transmission media. At any time, only a subset of the antennas/transmission channels may be active while the other antennas/transmission channels may be inactive. As a result, only a subset of the power amplifiers coupled to the active antennas/transmission channels may be drawing high current (e.g., around 60 mA to 80 mA) from their associated DAC channels while the power amplifiers coupled to the inactive antennas/transmission channels may be drawing a low/lower current (e.g., around 5 mA to 10 mA) from their associated DAC channels.

In some example embodiments, the DAC channels C1-CN may include a string DAC section and an interpolator section (not shown in FIG. 1). A DAC channel which includes a string DAC section and one or more interpolator sections is disclosed in U.S. patent application Ser. No. 17/581,516, filed Jan. 21, 2022, entitled "DIGITAL-TO-ANALOG CONVERTER WITH CASCADED LEAST SIGNIFICANT BIT (LSB) INTERPOLATOR CIRCUIT", assigned to the present assignee and incorporated herein by reference. The string DAC section produces an output which is a coarse representation of the digital input word, and the interpolator section produces an output which is a fine interpolation of a voltage between the coarse representation voltage and a second voltage which may be very close to the coarse representation voltage. In other example embodiments, the DAC channels may have a delta-sigma architecture or any other suitable architecture.

Each of the DAC channels C1-CN may include current sensors (e.g., current sensor 120-1 for channel C1) which measure output current supplied by the respective DAC channel. FIG. 1 only illustrates a current sensor for channel C1 for simplicity. The current sensors provide channel over-current alert signals (e.g., OVER-CURRENT-1 for C1) if the output current of a DAC channel rises above a channel over-current limit (HIGH-CURRENT-LIMIT). For example, the channel C1 includes the current sensor 120-1 which measures an output current IOUT-1 and provides an over-current alert signal OVER-CURRENT-1 if IOUT-1 rises above HIGH-CURRENT-LIMIT. The channel over-current limit HIGH-CURRENT-LIMIT may be a user-defined input as discussed below, set during manufacturing of the device and/or set during operation (e.g., by a state machine, processor or other digital circuitry and/or software). For example, if there are a total of 16 DAC channels and if each DAC channel can supply an output current around 50 mA, HIGH-CURRENT-LIMIT may be set even higher than 50 mA (e.g., 10% or 20% higher than 50 mA) provided the power supply is capable of satisfying the cumulative current demand from all DAC channels. Thus, if the power supply is capable of supplying 800 mA, HIGH-CURRENT LIMIT may be set, for example, equal to 60 mA so long as the power supply can satisfy the cumulative current demand. The effect of this is that one or more channels may be allowed to supply 60 mA for a limited time period if the power supply can satisfy the cumulative current demand from all DAC channels. In other example embodiments, HIGH-CURRENT-LIMIT may be channel-specific so that certain channels have a higher or lower limit than other channels.

In some example embodiments, the current sensor 120-1 measures the magnetic field (or other electrical, magnetic or mechanical indicia of the channel current) created when the output current IOUT-1 flows through the load 110-1, and in response generates a voltage which is translated to the amount of current through the load 110-1.

Figure 1B:
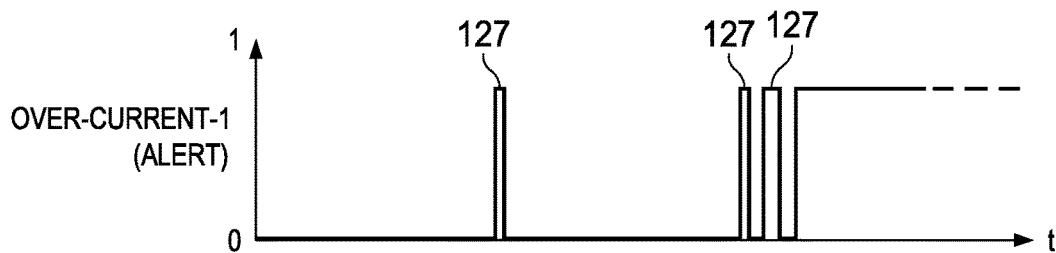
FIGS. 1B and 1C are waveforms of over-current alert and filtered over-current alert, respectively.
Figure 1C:

Each of the DAC channels C1-CN include respective analog (or digital) filters (only the filter for C1 is shown for simplicity) which filter the over-current alert signals. For example, C1 includes an analog (or digital) filter 124-1 (e.g., low-pass filter, high-pass filter or notch filter) which includes an input 126-1 coupled to receive the over-current alert signal OVER-CURRENT-1. The analog filter 124-1 removes certain frequency components (such as high frequency components if the filter is a low-pass filter) from OVER-CURRENT-1 and provides a filtered channel over-current alert signal FILTERED-OVER-CURRENT-1 at an output 126-2. If the output current IOUT-1 rises above HIGH-CURRENT-LIMIT momentarily and then falls back below HIGH-CURRENT-LIMIT, the analog filter 124-1 blocks OVER-CURRENT-1. The effect of this is that momentary glitches generated due to momentary over-current conditions are filtered. FIGS. 1B and 1C are example waveforms of inputs and outputs of the analog filter 124-1, respectively. The x-axis represents time and the y-axis represents over-current alert and filtered over-current alert signals. FIG. 1B shows a waveform OVER-CURRENT-1, which is the input to the analog filter 124-1. The waveform OVER-CURRENT-1 includes glitches 127 generated due to momentary over-current condition of the DAC channel C1. Thus, OVER-CURRENT-1 is the pre-filtered over-current status. FIG. 1C shows a waveform FILTERED-OVER-CURRENT-1 which is the output of the analog filter 124-1. The glitches 127 are filtered (e.g., removed) by the analog filter 124-1. Thus, FILTERED-OVER-CURRENT-1 is the post-filtered over-current status.

The system 100 includes a summer circuit 130 which includes inputs (132-1 . . . 132-N) coupled to the outputs of the analog filters for each of the respective DAC channels C1 through CN. The summer circuit 130 provides, at an output 134, a summation signal (SUMMATION) which indicates a number ("N") of channels that have exceeded the channel over-current limit. For example, the system 100 may include a total of 32 channels of which 10 channels may be in over-current condition. Thus, the summation signal SUMMATION will indicate that 10 channels (e.g., N is 10) have exceeded the channel over-current limit.

The system 100 includes a controller 140 that has a first input 142-1 coupled to receive a clock signal CLK which may be generated by a signal generator 144. In some example embodiments, a user may configure the signal generator 144 to provide the clock signal CLK of a desired frequency (e.g., 100 MHz, 200 MHz, 500 MHz). The controller 140 has a second input 142-2 coupled to receive a hysteresis signal (HYSTERIS) from a hysteriesis configuration module 141. The hysteresis signal HYSTERESIS indicates a hysteresis value ("H"). As explained below, the summation number N (indicated in the summation signal SUMMATION) must be less than a maximum number "M" minus H (i.e., N is less than (M−H)) in order to increase the output current limit from a lower current level to the channel over-current limit HIGH-CHANNEL-LIMIT. The controller 140 has a third input 142-3 coupled to receive a maximum channel limit signal (MAX-CHANNEL-LIMIT) from a threshold configuration module 145. The maximum channel limit signal MAX-CHANNEL-LIMIT indicates the maximum number ("M") of channels that must be in over-current condition in order to reduce the output current limit from HIGH-CHANNEL-LIMIT to a lower current limit LOW-LIMIT. In some example embodiments, MAX-CHANNEL-LIMIT and HYSTERESIS are user-configurable. For example, the maximum number of channels ("M") that is allowed to exceed MAX-CHANNEL-LIMIT may be based on the maximum current that can be supplied by a power supply coupled to the system 100.

The controller 140 includes a fourth input 142-4 coupled to receive the summation signal SUMMATION which indicates the number ("N") of DAC channels in over-current condition.

The controller 140 asserts a start limit signal (START-LIMIT) at an output 146 if the summation number N (indicated in SUMMATION) is greater than the maximum channel limit M (indicated in MAX-CHANNEL-LIMIT), and asserts an end limit signal (END-LIMIT) at the output 146 if the summation number N is less than or equal to M minus H (M−H). Thus, if the total number of channels in over-current condition exceeds the maximum allowable number M, the controller asserts START-LIMIT at the output 146. The controller 140, however, does not immediately assert END-LIMIT if the total number of channels in over-current condition falls below M. Instead, the controller 140 waits until the total number of channels in over-current condition is less than M minus H before asserting END-_LIMIT.

In operation, due to high channel current demand, one or more channels may operate just above the channel over-current limit HIGH-CURRENT-LIMIT. If the channel current demand slightly decreases, those channels may operate slightly below HIGH-CURRENT-LIMIT, which may prompt the controller 140 to assert END-LIMIT. If the channel current demand increases, these channels may operate slightly above HIGH-CURRENT-LIMIT, prompting the controller 140 to assert START-LIMIT. As a result, the DAC 100 will be forced to activate and de-activate over-current protection which may not be necessary. By implementing the hysteresis, the controller 140 is prevented from asserting END-LIMIT and immediately thereafter asserting START- LIMIT, and thus prevent the system from oscillating. The hysteresis value H may indicate a number (e.g., number of DAC channels). The controller 140, or parts thereof, may be implemented in hardware (e.g., logic circuitry, state machine, microprocessor, memory and/or application-specific-integrated-circuit), firmware and/or software.

Each of the DAC channels C1-CN include respective current control circuits which reduce the output current limit of the DAC channels in response to the start limit signal START-LIMIT and increase the output current limit in response to the end limit signal END-LIMIT. For example, the channel C1 includes a current control circuit 150-1 which has a first input 152-1 coupled (either directly or indirectly through a digital filter 160) to the output 146 of the controller 140. In response to the start limit signal START-LIMIT, the current control circuit 150-1 reduces the output current limit of the DAC channel C1 from HIGH-CURRENT-LIMIT to a lower current level LOWER-LIMIT, and increases the output current limit back to HIGH-CURRENT-LIMIT in response to END-LIMIT. Unlike existing multi-channel DACs which shut down individual DAC channels if their output currents exceed a peak current limit, the disclosed embodiments allow individual DAC channels to supply output current that may exceed the peak current limit for a brief period if the total number of channels in over-current condition is less than the maximum allowable number (e.g., M) of channels in over-current condition and the power supply is capable to supplying the cumulative current demand by all channels. For example, HIGH-CURRENT-LIMIT may be set equal to 60 mA and the maximum number M of channels allowed to be in over-current condition may be set equal to five. If four channels exceed HIGH-CURRENT-LIMIT (e.g., four channels each supply 65 mA), those four channels may be allowed to continue to operate despite exceeding HIGH-CURRENT-LIMIT if the power supply is able to satisfy the total cumulative current demand from all the DAC channels. In some example embodiments, HIGH-CURRENT-LIMIT for the DAC channels may be set during fabrication. Some other example embodiments allow for the setting of the maximum current of a system but allowing a higher maximum current per individual channels (so long as the maximum system current is not exceeded), rather than reducing the maximum current of all channels to ensure that the total current of the system is within their supply capability.

Figure 2:
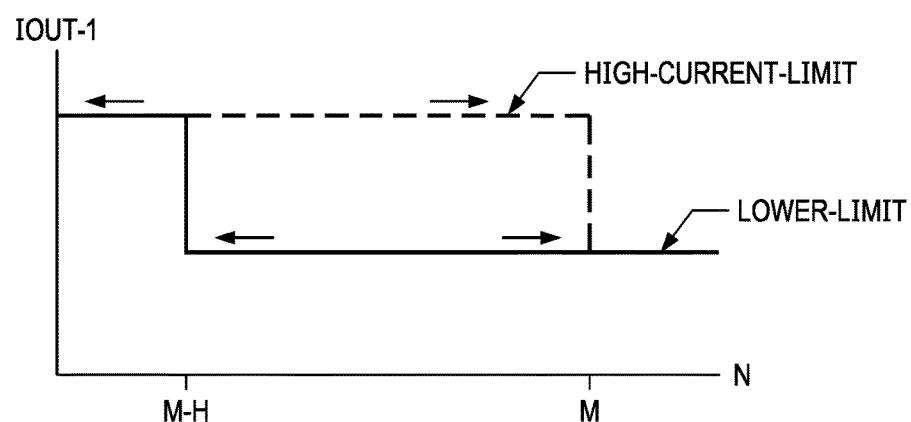
FIG. 2 illustrates increasing and decreasing the output current limit of the DAC channels of an example embodiment.

FIG. 2 illustrates increasing the output current limit of the DAC channels to HIGH-CURRENT-LIMIT in response to the assertion of the START-LIMIT signal and reducing the output current limit of the DAC channels to a lower current level LOWER LIMIT in response to the assertion of the END-LIMIT signal. The x-axis represents the total number of channels in over-current condition, and the y-axis represents the output current.

If the total number N of channels in over-current condition is greater than the maximum number M of channels allowed to be in over-current condition, the DAC 100 asserts START-LIMIT, which causes the current control circuits in all channels (e.g., current control circuits 150-1-150-N for DAC channel C1-CN, respectively) to reduce the output current limit to a lower level LOWER-LIMIT. Thus, in response to an assertion of START-LIMIT, the output current of all DAC channels (e.g., C1-CN) are reduced to the lower level LOWER-LIMIT. This is shown in FIG. 2 by the dashed line. Afterwards, if N falls below M, the current control circuit for each DAC channel (e.g. current control circuit 150-1 for DAC channel C1) does not immediately increase the output current limit. This is shown in FIG. 2 by the lower solid line between "M" and "M–H". Instead, the current control circuit for each DAC channel waits until N is less than (M–H) before increasing the output current limit. When the output current limit is increased, the output current of the DAC channels (e.g., IOUT-1 in C1) is allowed to rise. By implementing the hysteresis H, the controller 140 is prevented from asserting END-LIMIT and immediately thereafter asserting START-LIMIT, and thus prevent the system 100 from oscillating.

In some example embodiments, the system 100 includes the digital filter 160 which is incorporated between the output 146 of the controller 140 and the inputs to each DAC channel (e.g., inputs 152-1 . . . 152-N of the current limit circuits 150-1 . . . 150-N). The digital filter 160 has an input 162 coupled to the output 146 of the controller 140. If the controller 140 asserts END-LIMIT, the digital filter 160 applies a time delay (e.g., 1 mS, 10 mS) to the signal END-LIMIT and provides the delayed END-LIMIT at an output 164. If, however, the controller asserts START-LIMIT, the digital filter 160 does not apply a time delay to START-LIMIT but simply forwards it to the output 164. Thus, in response to an over-current condition, if the controller 140 asserts START-LIMIT, the digital filter 160 forwards the signal without applying a time delay, which allows the current control circuits in each DAC channel to apply current limit immediately without any delay and thus prevent damage to the DAC channels. If, however, the controller 140 asserts END-LIMIT (because the total number of channels in over-current condition has fallen below M-H), the digital filter 160 adds the time delay which prevents potential oscillation caused by one or more DAC channels falling below the maximum allowable number momentarily before rising above the maximum allowable number.

In some example embodiments, the system 100 reduces the output current limit of all of the DAC channels (e.g., C1-CN) even if only a subset of the total number of the DAC channels are in over-current condition. For example, the system 100 may have a total of 16 DAC channels (e.g., C1-C16) and the maximum number of channels that can operate above the channel over-current limit HIGH-CHANNEL-LIMIT may be set equal to five. If six channels exceed HIGH-CURRENT-LIMIT (i.e., over-current condition), the controller 140 asserts START-LIMIT which causes the current control circuit 150 to lower the output currents of all channels (C1-C16) from HIGH-CURRENT-LIMIT (e.g., 50 mA) to LOWER-LIMIT (e.g., 10 mA). In other embodiments, controller 140 only reduces the current for certain DAC channels (e.g., the six channels that are over the limit and/or channels that have a history of exceeding the current limit).

Figure 3:
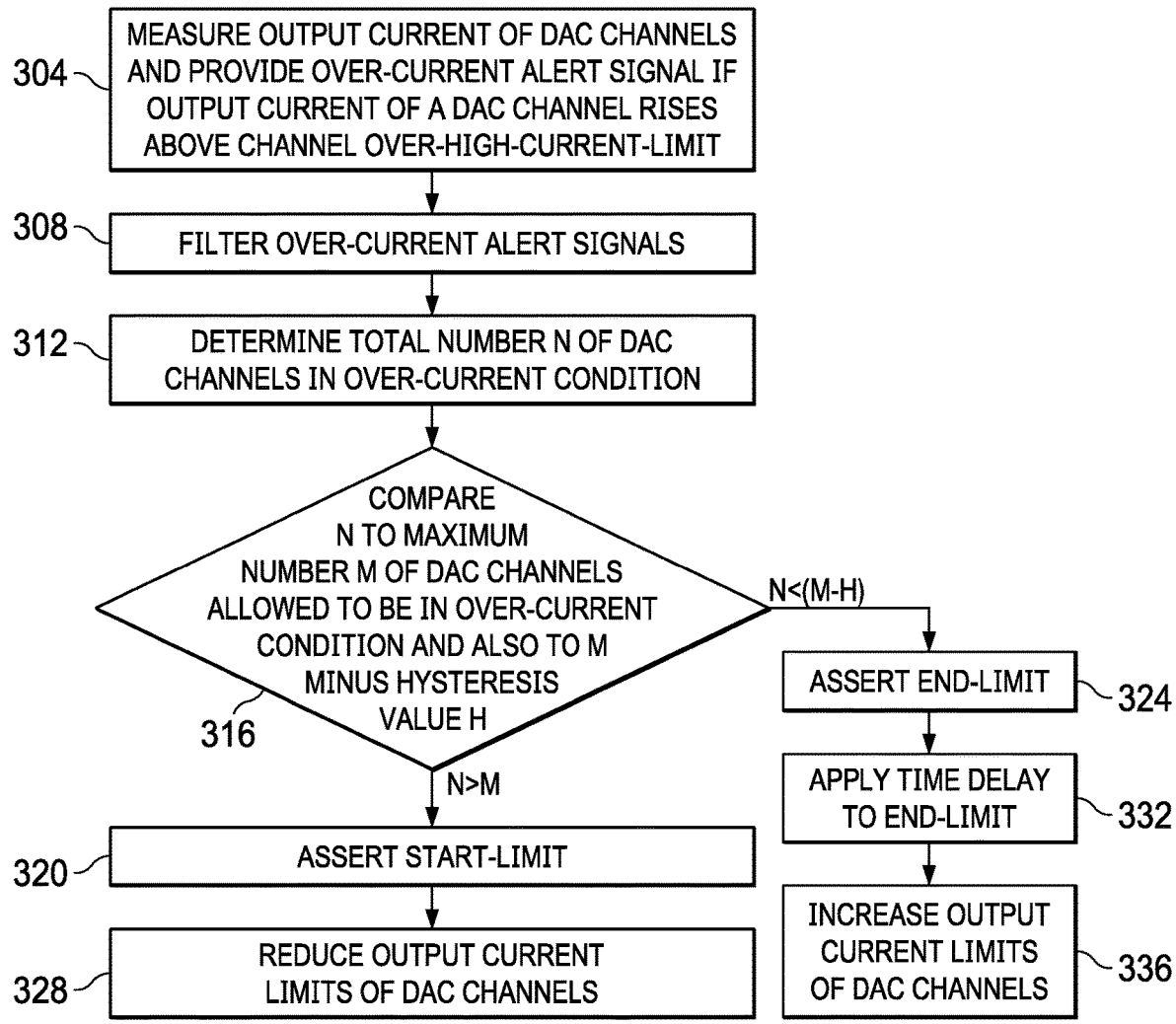
FIG. 3 is a flow diagram of a method of an example embodiment.

FIG. 3 is a flow diagram of a method 300 of an example embodiment. In block 304, output currents of the DAC channels are measured and an over-current alert signal is generated if the output current of a DAC channel rises above a channel over current limit HIGH-CURRENT-LIMIT. In an example embodiment, the current sensors for each DAC channel (e.g., 120-1 . . . 120-N) measure the output currents of the associated DAC channels, and provide over-current alert signal if the output current of a DAC channel rises above HIGH-CURRENT-LIMIT.

In block 308, one or more over-current alert signals are filtered to remove spurious and/or transient components (e.g., removing high frequency components).

In block 312, the total number of DAC channels in over-current condition is determined. In an example embodiment, the summation circuit 130 determines the total number N (also referred to as summation number N) of DAC channels in over-current condition based on the number of over-current alert signals. In block 316, the summation number N is compared to the maximum number M of channels that is allowed to operate in over-current condition and is also compared to M minus H (M−H), where H is the hysteresis value. In an example embodiment, the controller 140 compares N to M and also compares N to (M−H). If N is greater than M (N>M), a start limit signal START-LIMIT is asserted (in block 320). If N is less than M minus H (N<(M−H)), an end limit signal END-LIMIT is asserted (in block 324). If START-LIMIT is asserted, the output current limits of the DAC channels C1-CN are reduced to a lower current level LOWER-LIMIT (in block 328). In an example embodiment, the current control circuits for each DAC channel (e.g., 150-1 . . . 150-N) reduces the output current limits of the respective DAC channels to the lower current level in order to protect the DAC channels. If END-LIMIT is asserted, a time delay is applied to END-LIMIT (in block 332), and thereafter (in block 336), the output current limits are increased to a higher level (e.g., HIGH-CURRENT-LIMIT). In an example embodiment, the digital filter 160 applies the time delay to END-LIMIT and provides the delayed END-LIMIT to the current control circuits for each of the DAC channels. In response, the current control circuits for each of the DAC channels increases the output current limit to HIGH-CURRENT-LIMIT.

The system described herein may include one or more semiconductor elements (such as transistors), one or more passive elements (such as resistors, capacitors and/or inductors), and/or one or more sources (such as voltage and/or current sources). The system 100 may include only semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party. While some example embodiments may include certain elements implemented in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground terminal" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means+/−10 percent of the stated value, or, if the value is zero, a reasonable range of values around zero.

Modifications are possible in the described embodiments, and other embodiments are possible, within the scope of the claims.

What is claimed is:

1. A multi-channel digital-to-analog converter (DAC) comprising:
a plurality of DAC channels each having an input adapted to receive a digital input signal and operable convert the digital input signal to an analog output signal;
each DAC channel comprising:
a current control circuit having a first input adapted to receive a start limit signal or an end limit signal, the current control circuit operable to reduce an output current limit, for the DAC channel, from a higher current limit to a lower current limit responsive to the start limit signal and to increase the output current limit to the higher current limit responsive to the end limit signal;
a current sensor circuit coupled to the current control circuit and operable to provide an alert signal responsive to an output current of the DAC channel exceeding the higher current limit; and
filter coupled to the current sensor circuit and operable to provide a filtered alert signal responsive to the alert signal;
a summer circuit coupled to each DAC channel and operable to provide a summation signal indicating the number of DAC channels exceeding the higher current limit; and
a controller coupled to the summer circuit and operable to provide the start limit signal responsive to the summation signal exceeding a threshold and to provide the end limit signal responsive to the summation signal falling below the threshold minus a hysteresis value.

2. The DAC of claim 1, further comprising a digital filter coupled to the controller and operable to apply a time delay to the end limit signal.

3. The DAC of claim 1, further comprising a digital filter coupled to the controller and operable pass the start limit signal without applying a time delay.

4. The DAC of claim 1, wherein the filter is a low pass filter operable to remove high frequency components from the alert signal and to provide the filtered alert signal.

5. The DAC of claim 1, wherein the controller comprises a comparison circuit operable provide the start limit signal or the end limit signal by comparing summation signal to the threshold and to the threshold minus the hysteresis value.

6. The DAC of claim 1, wherein responsive to a rising edge or a falling edge of a clock signal, the controller is operable to compare the summation signal to the threshold and to the threshold minus the hysteresis value.

7. A multi-channel digital-to-analog converter (DAC) comprising:
a plurality of DAC channels each having a digital signal input and an analog signal output;
each DAC channel comprising:
a current control circuit having a first input adapted to receive a start limit signal or a delayed end limit signal, the current control circuit operable to reduce an output current limit of the DAC channel from a higher current limit to a lower current limit responsive to the start limit signal and to increase the output current limit to the higher current limit responsive to the delayed end limit signal;
a current sensor circuit coupled to the current control circuit and operable provide an alert responsive to an output current of the DAC channel exceeding the higher current limit;
a low-pass filter coupled to the current sensor circuit and operable to provide a filtered alert signal responsive to the alert signal;
a summer circuit coupled to each DAC channel and operable to provide a summation signal indicating the number of DAC channels exceeding the higher current limit;
a controller coupled to the summer circuit and operable to provide the start limit signal responsive to the summation signal exceeding a threshold and to provide the end limit signal responsive to the summation signal falling below the threshold minus a hysteresis value; and
a digital filter coupled to the controller and operable to provide the delayed end limit signal by applying a time delay to the end limit signal and operable to pass the start limit signal.

8. The DAC of claim 7, wherein the controller comprises a comparison circuit operable provide the start limit signal or the end limit signal by comparing the summation signal to the threshold and to the threshold minus the hysteresis value.

9. The DAC of claim 7, wherein responsive to a rising edge or a falling edge of a clock signal, the controller is operable to compare the summation signal to the threshold and to the threshold minus the hysteresis value.

10. The DAC of claim 7, wherein the digital filter is operable to pass the start limit signal without applying a time delay.

11. A method of over-current protection for a multi-channel digital-to- analog converter (DAC), the method comprising:
providing an alert signal for each DAC channel that has an output current that exceeds a higher current limit;
determining a sum of responsive to the alert signals;
providing a start limit signal responsive to the sum exceeding a threshold;
providing an end limit signal responsive to the sum falling below the threshold minus a hysteresis value;
reducing an output current limit of the DAC channels from the higher current limit to a lower current limit responsive to the start limit signal; and
increasing the output current limit of the DAC channels from the lower current limit to the higher current limit responsive to of the end limit signal.

12. The method of claim 11, further comprising delaying increasing the output current limit from the lower current limit to the higher current by applying a time delay to the end limit signal.

13. The method of claim 11, further comprising not delaying reducing the output current limit from the higher current limit to the lower current limit by not applying a time delay to the start limit signal.

14. The method of claim 11, further comprising providing the start limit signal or the end limit signal responsive to a rising edge of a clock signal.

15. The method of claim 11, further comprising providing the start limit signal or the end limit signal responsive to a falling edge of a clock signal.

16. The DAC of claim 1, wherein the filter is an analog filter.

17. A digital-to-analog converter (DAC) comprising:
DAC channels each having an output, and each DAC channel comprising:
a current control circuit having an input, the current control circuit configured to change an output current limit, for the DAC channel, from a higher current limit to a lower current limit responsive to the start limit signal and to change the output current limit from the lower current limit to the higher current limit responsive to the end limit signal; and a current sensor circuit coupled to the output of the DAC channel and having an output, the current sensor circuit configured to provide an alert signal responsive to an output current of the DAC channel exceeding the higher current limit;

a summer circuit coupled to the outputs of the current sensor circuits and having an output, the summer circuit configured to provide a summation signal indicating the number of DAC channels exceeding the higher current limit; and a controller coupled having an input coupled to the output of the summer circuit and having one or more outputs to the inputs of the current control circuits, the controller configured to provide the start limit signal responsive to the summation signal exceeding a threshold and to provide the end limit signal responsive to the summation signal falling below the threshold minus a hysteresis value.

18. The DAC of claim 17, each DAC channel further comprising a filter coupled between the output of the current sensor circuit and the input of the summer circuit.

19. The DAC of claim 18, wherein the filter is configured to suppress alert signals having a time duration less than a time-duration threshold.

20. The DAC of claim 17, further comprising a circuit coupled between the one or more outputs of the controller and the inputs of the current control circuits and configured to apply a time delay to the end limit signal.

* * * * *